Oct. 6, 1970 F. L. GITTLER 3,532,564

METHOD FOR DIFFUSION OF ANTIMONY INTO A SEMICONDUCTOR

Filed May 31, 1968

INVENTOR
F.L. GITTLER
BY

ATTORNEY

United States Patent Office 3,532,564

Patented Oct. 6, 1970

3,532,564
METHOD FOR DIFFUSION OF ANTIMONY INTO A SEMICONDUCTOR

Frank L. Gittler, Allentown, Pa., assignor to Bell Telephone Laboratories, Incorporated, Murray Hill and Berkeley Heights, N.J., a corporation of New York Filed May 31, 1968, Ser. No. 733,539
Int. Cl. H01l 7/00, 7/36
U.S. Cl. 148—188 7 Claims

ABSTRACT OF THE DISCLOSURE

Trimethylstibine and silane are reacted at about 315 degrees centigrade on the surface of a silicon semiconductor body to form an antimony doped silicon oxide layer thereon. Another, comparatively pure, silicon dioxide layer then is provided over the doped oxide layer and remains in place thereon during a subsequent drive-in heat treatment carried out at higher temperatures and for times sufficient to diffuse antimony into the silicon body.

BACKGROUND OF THE INVENTION

Figure 1:
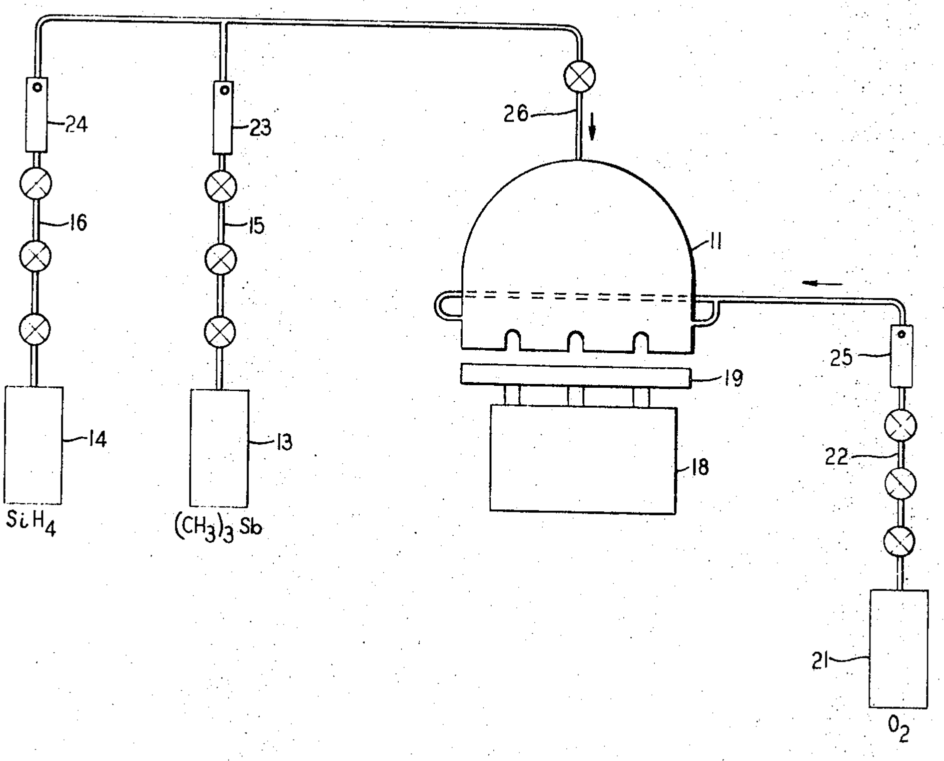

The invention relates to the solid state diffusion of a significant impurity into a semiconductor body to alter the electrical conductivity of the portions of the body thus treated. In particular, the invention involves the introduction of a donor impurity, antimony, into a semiconductor body from a film of mixed composition containing antimony formed on the surface of the semiconductor body.

The solid state diffusion of various significant impurity elements both directly from the vapor state and from a solid to alter or convert the conductivity of portions of a semiconductor body is a well-known technique. The donor impurity, antimony, is advantageous as a diffusant because of its relatively low rate of diffusion especially when compared with that of boron, a useful acceptor type diffusant. For many applications, such as in high frequency semiconductor devices and in semiconductor devices in which a high surface concentration of impurity is desired, the lesser penetration depth of a slower diffusing impurity is desirable.

For example, in double diffused semiconductor devices such as high frequency PNP silicon transistors, the movement of an antimony diffusion front during a given diffusion heating time will be a minimum compared to other diffusants, particularly phosphorus, enabling shallower conductivity type zones. Also, the slow movement of the antimony enables the accumulation of a higher impurity concentration near the surface, another advantageous characteristic, particularly for certain aspects of integrated circuit fabrication.

In the base zone of a transistor, diffusion of antimony has generally been carried out using solid compounds of antimony as sources. For example, antimony trioxide ($Sb_2O_3$) is a solid at ordinary temperatures and is used widely for diffusion heat treatments. In my application, Ser. No. 622,693, filed Mar. 13, 1967, there is described the use of a compound, antimony III ethoxide, a liquid at ordinary temperatures, which provides a desirable antimony source material. However, both the solid and liquid sources, and particularly the solid, have relatively low vapor pressures, thus reducing the level of surface concentration of the impurity attainable in a given heating time. Moreover, even the liquid source requires temperatures of about 800 degrees centigrade or more.

In accordance with this invention, antimony diffusion is carried out using a doped oxide on the semiconductor surface as the impurity source for such diffusion. The impurity doped oxide is formed at a relatively low temperature, from about 300–400 degrees centigrade, by reacting relatively equal quantities by volume of trimethylstibine and silane in a nitrogen ambient which also may contain a small amount of oxygen. During this reaction a mixed composition film containing an antimony oxide is formed on the exposed surface of the semiconductor body in the reaction chamber. A relatively thick, heavily antimony doped film is formed in a relatively short time after which the trimethylstibine supply is cut off and a more nearly pure silicon dioxide layer is formed over the doped oxide film. This acts as a "cap" to seal against escape of the impurity. Diffusion is then accomplished by heating at a higher temperature for sufficient time to drive in the diffusant to alter the conductivity of the semiconductor body.

The comparatively low temperature at which the antimony-doped oxide is deposited does not produce deleterious surface etching, enabling preservation of surface quality. The oxides of antimony are not soluble in silicon oxide to any great degree, at least, in comparison to boron and phosphorus. Thus, an antimony-doped oxide cannot be deposited at the higher temperatures required by a liquid source. Without such an oxide present the semiconductor surface generally is etched severely.

Figure 2:
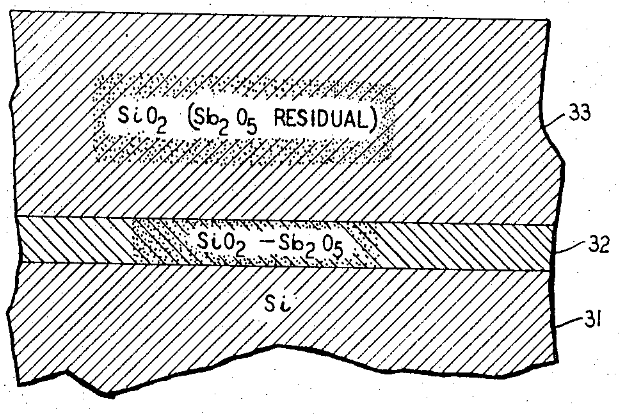

A better understanding of the invention and its objects and features may be had from the following detailed description taken in connection with the drawing in which FIG. 1 is a schematic representation of apparatus for carrying out the oxide deposition and FIG. 2 is a partial cross section for a semiconductor body with the doped oxide and protective oxide films thereon.

Referring to FIG. 1, the semiconductor body, in this particular embodiment monocrystalline silicon slices, are positioned on a rotating hot plate in the reaction chamber 11. The reactant gases are admitted to the reaction chamber 11 by way of the inlet pipe 26. A glass frit, not shown, may be installed in the upper portion of the chamber to distribute the gases. Both trimethylstibine and silane are supplied diluted in nitrogen carrier gas from the source tanks 13 and 14, respectively, by way of the supply lines 15 and 16. Suitable pressure regulators, solenoid controlled valves, and needle valves are provided in both lines. Lines 15 and 16 include flow meters 23 and 24. Trimethylstibine is supplied at low concentrations typically about 1% in nitrogen. As a precaution, it should be noted that this antimony compound is generally unstable at concentrations in excess of 5% at 200 lbs. per square inch in nitrogen atmospheres. The silane typically is provided at a corresponding level of concentration in nitrogen. An additional piping system is shown connecting an oxygen source 21 by way of inlet line 22 and flow meter 25 to a pair of inlets to the reaction chamber.

In a typical deposition run an array of silicon slices are placed on the circular turntable of the hot plate which then is raised into the reaction chamber 11. The temperature of the hot plate is held at about 360 degrees and the three gas mixtures from the source tanks 13, 14 and 21 are admitted for a short period. After a period of about five minutes an antimony-doped oxide film having a thickness of about 40 A. is formed. The reactant trimethylstibine then is cut off and silane is admitted with oxygen to produce an additional thick layer primarily of silicon dioxide.

A partial cross section of the oxide-coated surface of a slice at this stage of the process is shown in FIG. 2. On the surface of the silicon substrate 31 is a thin layer 32 which is largely antimony oxide ($Sb_2O_5$) mixed with some silicon dioxide ($SiO_2$), the amount of the latter being largely determined by the amount of silane ($SiH_4$)

bled into the system. This layer 32 is the source of antimony diffusant. To prevent, in effect, evaporation of this diffusant, a relatively thick cap or cover layer 33 of substantially pure silicon oxide is applied over the doped oxide layer 32.

Following the deposition process the slices are removed and placed in a diffusion furnace and heated for an extended period at temperatures in the range from 1250 to 1300 degrees centigrade for about one hour.

The results of a series of runs at different temperatures, each run involving several slices, are set forth in the following table.

| | Temp., ° C. | Average sheet resistance, ohms per square | Junction depth, microns |
|---|---|---|---|
| Run: | | | |
| 1 | 1,284 | 12.9 | 5.89 |
| 2 | 1,277 | 15.3 | 5.60 |
| 3 | 1,278 | 13.8 | 6.18 |
| 4 | 1,275 | 17.3 | 4.86 |

It will be understood that the foregoing diffusion of antimony may be limited to a portion of the semiconductor body by conventinonal masking techniques now well known in the art whereby the extent of doped oxide deposition is limited to a particular portion of the semiconductor body. For example, one extremely useful configuration for the antimony diffusion in accordance with this invention is represented by the initial masked diffusion into a P type conductivity silicon substrate of small N type antimony diffused areas for forming high conductivity buried layers in integrated circuit devices. After diffusion of the antimony-doped buried collector zones, an epitaxial semiconductor layer is formed over the entire substrate rendering the antimony diffused portions buried in order to reduce the collector resistance of integrated transistors. In this application antimony is particularly desirable as a dopant because of its relatively slow movement during the subsequent diffusion heat treatments.

Moreover, although the specific embodiment is in terms of the treatment of silicon, the invention is applicable to other semiconductor materials. In particular, it is very useful with germanium, taking into consideration the somewhat lower diffusion temperatures required than for silicon. It may also be used with the compound semiconductors, such as gallium arsenide, of the III–V type, subject to the limitations usually observed in connection with the heat treatment of these materials.

What is claimed is:

1. In the fabrication of a semiconductor device a process for forming an antimony-containing oxide layer on at least a portion of the surface of a semiconductor body comprising exposing said body at an elevated temperature to a mixture including trimethylstibine and silane.

2. The process in accordance with claim 1 in which said mixture also includes oxygen.

3. The process in accordance with claim 1 in which the elevated temperature is between about 300 and 400 degrees centigrade.

4. The process in accordance with claim 1 in which said semiconductor body is one selected from the group consisting of silicon, germanium, and the III–V compound semiconductors.

5. The process in accordance with claim 1 in which the semiconductor body is silicon.

6. The process in accordance with claim 1 in which the semiconductor body is germanium.

7. In the fabrication of a semiconductor device the steps of forming an antimony-containing oxide layer on portions of the surface of a semiconductor body by exposing said body in a closed chamber at an elevated temperature to a mixture including trimethylstibine and silane followed by the step of forming a layer substantially of silicon oxide over said antimony-containing layer, followed by the step of heating said body at an elevated temperature for a period of time sufficient to enable diffusion of antimony from said layer into said body to alter the conductivity therein.

References Cited

UNITED STATES PATENTS 3,215,570 11/1965 Andrews et al. ______ 148—188
3,437,533 4/1969 Dingwall __________ 148—188

L. DEWAYNE RUTLEDGE, Primary Examiner

R. A. LESTER, Assistant Examiner

U.S. Cl. X.R.

117—201; 148—186, 189, 190